United States Patent
Shimizu (10) Patent No.: US 10,207,373 B2
(45) Date of Patent: Feb. 19, 2019

(54) NICKEL PARTICLE COMPOSITION, BONDING MATERIAL, AND BONDING METHOD IN WHICH SAID MATERIAL IS USED

(71) Applicant: NIPPON STEEL & SUMIKIN CHEMICAL CO., LTD., Tokyo (JP)

(72) Inventor: Takayuki Shimizu, Tokyo (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 54 days.

(21) Appl. No.: 15/323,092

(22) PCT Filed: Jun. 30, 2015

(86) PCT No.: PCT/JP2015/068757
§ 371 (c)(1),
(2) Date: Dec. 29, 2016

(87) PCT Pub. No.: WO2016/002741
PCT Pub. Date: Jan. 7, 2016

(65) Prior Publication Data
US 2017/0136585 A1 May 18, 2017

(30) Foreign Application Priority Data

Jun. 30, 2014 (JP) .................................. 2014-135245

(51) Int. Cl.
*B23K 35/02* (2006.01)
*B22F 1/00* (2006.01)
(Continued)

(52) U.S. Cl.
CPC ........ *B23K 35/3033* (2013.01); *B22F 1/0014* (2013.01); *B22F 1/0074* (2013.01);
(Continued)

(58) Field of Classification Search
None
See application file for complete search history.

(56) References Cited

U.S. PATENT DOCUMENTS

| 6,375,703 B1 * | 4/2002 | Chou | B22F 1/004 |
| | | | 428/606 |
| 7,262,511 B2 * | 8/2007 | Osako | H01L 24/29 |
| | | | 252/512 |

(Continued)

FOREIGN PATENT DOCUMENTS

| JP | H05-255709 | 10/1993 |
| JP | 2000331534 | 11/2000 |

(Continued)

OTHER PUBLICATIONS

"Search Report of Europe Counterpart Application", dated Jan. 25, 2018, p. 1-p. 5, in which the listed reference was cited.

(Continued)

*Primary Examiner* — Devang R Patel
(74) *Attorney, Agent, or Firm* — JCIPRNET (57) ABSTRACT

A nickel particle composition is shown, including: A) a nickel particle having an average particle size in the range of 0.5 μm to 20 μm obtained via a laser diffraction/scattering method and containing 50 wt % or more of a nickel element; B) a nickel fine particle having an average primary particle size in the range of 30 nm to 200 nm observed via a scanning electron microscope and containing 50 wt % or more of a nickel element; and C) an organic binder in the range of 0.1 wt % to 2.5 wt % relative to the total metal content; and the weight ratio of a component A to a component B (component A:component B) is in the range of 30:70 to 70:30.

9 Claims, 4 Drawing Sheets

(51) Int. Cl.
| | |
|---|---|
| *B23K 35/30* | (2006.01) |
| *B23K 20/00* | (2006.01) |
| *B23K 35/22* | (2006.01) |
| *H01B 1/22* | (2006.01) |
| *H01L 23/373* | (2006.01) |
| *H01L 21/52* | (2006.01) |
| *B23K 1/00* | (2006.01) |
| *B23K 35/36* | (2006.01) |
| *H01L 23/00* | (2006.01) |
| *B22F 7/08* | (2006.01) |
| *B22F 9/24* | (2006.01) |
| *C22C 19/03* | (2006.01) |

(52) U.S. Cl.
CPC ............ *B23K 1/0016* (2013.01); *B23K 20/00* (2013.01); *B23K 35/0244* (2013.01); *B23K 35/22* (2013.01); *B23K 35/30* (2013.01); *B23K 35/3612* (2013.01); *H01B 1/22* (2013.01); *H01L 21/52* (2013.01); *H01L 23/373* (2013.01); *H01L 24/29* (2013.01); *H01L 24/32* (2013.01); *H01L 24/83* (2013.01); *B22F 7/08* (2013.01); *B22F 9/24* (2013.01); *B22F 2301/15* (2013.01); *B22F 2302/45* (2013.01); *B22F 2304/054* (2013.01); *B22F 2304/056* (2013.01); *B22F 2304/10* (2013.01); *C22C 19/03* (2013.01); *H01L 2224/29155* (2013.01); *H01L 2224/832* (2013.01); *H01L 2224/83065* (2013.01); *H01L 2924/0002* (2013.01); *H01L 2924/2011* (2013.01); *H01L 2924/20106* (2013.01); *H01L 2924/20107* (2013.01); *H01L 2924/20108* (2013.01); *H01L 2924/20109* (2013.01)

(56) References Cited

U.S. PATENT DOCUMENTS

| | | | | |
|---|---|---|---|---|
| 7,955,411 | B2* | 6/2011 | Yasuda | B22F 1/0014 75/228 |
| 8,815,648 | B1* | 8/2014 | Aoya | H01L 24/85 438/112 |
| 8,889,065 | B2* | 11/2014 | Chelluri | B22F 1/0014 419/10 |
| 2005/0262966 | A1* | 12/2005 | Chandler | B01J 2/006 75/331 |
| 2006/0216540 | A1 | 9/2006 | Budinger et al. | |
| 2007/0166455 | A1* | 7/2007 | Shen | B22F 1/02 427/216 |
| 2009/0107584 | A1* | 4/2009 | Sengupta | B22F 1/0059 148/24 |
| 2010/0124514 | A1* | 5/2010 | Chelluri | B22F 1/0014 419/13 |
| 2013/0250538 | A1* | 9/2013 | Le | B23K 3/085 361/807 |

FOREIGN PATENT DOCUMENTS

| | | |
|---|---|---|
| JP | 4633857 | 2/2011 |
| JP | 2011080147 | 4/2011 |
| JP | 4795483 | 10/2011 |
| JP | 4872663 | 2/2012 |
| TW | 201335231 | 9/2013 |
| WO | 0235554 | 5/2002 |

OTHER PUBLICATIONS

"International Search Report (Form PCT/ISA/210) of PCT/JP2015/068757", dated Sep. 29, 2015, with English translation thereof, pp. 1-5.

Office Action of Taiwan Counterpart Application, with English translation thereof, dated Sep. 12, 2018, pp. 1-8.

* cited by examiner

NICKEL PARTICLE COMPOSITION, BONDING MATERIAL, AND BONDING METHOD IN WHICH SAID MATERIAL IS USED

CROSS-REFERENCE TO RELATED APPLICATION

This application is a 371 application of the international PCT application serial no. PCT/JP2015/068757, filed on Jun. 30, 2015, which claims the priority benefit of Japan application no. 2014-135245, filed on Jun. 30, 2014. The entirety of each of the abovementioned patent applications is hereby incorporated by reference herein and made a part of this specification.

BACKGROUND OF THE INVENTION

Field of the Invention

The invention relates to a nickel particle composition that can be used in the manufacture of an electronic component and a bonding material and a bonding method using the same.

In recent years, high efficiency of inverters and other power converters has been developing in the research process of power saving. In particular, the practical application of SiC (silicon carbide) is being researched for the next-generation low-loss power device semiconductor material. However, the driving temperature of the current Si (silicon) power device is about 125° C., and in comparison, SiC is estimated to be 250° C. or more, and therefore a bonding material bonding a power semiconductor chip and a mounting substrate needs to have reliability in high-temperature driving.

Moreover, based on the RoHS directive implemented by the EU in 2006, a lead-free solder material is in demand, but a satisfactory replacement material for the lead solder in the high-temperature region has not yet been found.

Many attempts are being made to replace the solder material by bonding method utilizing physical properties of a small-size metal represented by a silver particle. For instance, in patent literature 1, the volatile component of a silver particle bonding material submicron to several microns in size is vaporized at 200° C., and heating is performed at 300° C. or 350° C. to obtain a bonding strength about 20 MPa to 40 MPa.

Therefore, a bonding material containing nano-size silver particles has also been provided. For instance, the bonding material recited in patent literature 2 is formed by mixing silver particles having an average particle size of 58.8 nm covered by sorbic acid and globular silver powder having a size of 600 nm, and is disclosed to have a maximum bonding strength of 100 MPa. Moreover, patent literature 3 discloses changing the volume particle size distribution of the silver particles used in the bonding material to bimodal, such that bonding strength is increased in comparison to silver particles having a unimodal distribution.

However, as described in the patent literatures . . . etc., the component of the metal particles is mostly noble metal, and today examples of a bonding material using an inexpensive metal such as nickel still do not exist. Not only that, as recited in patent literature 4, the bonding material of flaky nickel particles cannot obtain sufficient bonding strength.

Moreover, in the bonding recited in patent literature 2 or patent literature 3, pressure needs to be applied to the members to be bonded in the heating process, and if adaptation in industrial processes is considered, then complication in equipment and increase in cost compared to the case in which pressure is not applied are potential issues.

CURRENT TECHNICAL LITERATURE

Patent Literature

Patent literature 1: JP 4795483 B
Patent literature 2: JP 2011-80147 A
Patent literature 3: JP 4872663 B
Patent literature 4: JP 4633857 B

SUMMARY OF THE INVENTION

Issues to be Solved by the Invention

The invention forms the following bonding layer, wherein the bonding layer does not include a noble metal such as silver, and therefore even if no pressure is applied on the members to be bonded, sufficient bonding strength can still be obtained.

Regarding the issue, the inventors et al. discovered that by using the following bonding material and a bonding method using the bonding material in which heating is performed at a temperature in the range of 250° C. to 400° C. in a reductive gas environment containing a reductive gas, a noble metal such as silver is not needed, and therefore even if pressure is not applied to the members to be bonded, sufficient bonding strength can still be obtained. The bonding material contains a nickel particle composition, and the nickel particle composition contains a nickel fine particle having a size of 30 nm to 200 nm that readily undergoes inter-particle sintering by heating and a nickel particle having a size of 0.5 μm to 20 μm supporting the bonded body as a skeleton by inhibiting the overall volume contraction of the bonding layer.

The nickel particle composition of the invention includes the following component A to component C:

A) a nickel particle having an average particle size in the range of 0.5 μm to 20 μm obtained via a laser diffraction/scattering method and containing 50 wt % (weight percentage) or more of a nickel element;

B) a nickel fine particle having an average primary particle size in the range of 30 nm to 200 nm observed via a scanning electron microscope and containing 50 wt % or more of a nickel element; and C) an organic binder in the range of 0.1 wt % to 2.5 wt % relative to the total metal content; and the weight ratio of the component A to the component B (component A:component B) is in the range of 30:70 to 70:30.

In the nickel particle composition of the invention, the content of the nickel element of the component A can be 99.0 wt % or more.

In the nickel particle composition of the invention, the content of the nickel element of the component B can be in the range of 90 wt % to 99.0 wt %.

In the nickel particle composition of the invention, the content of the nickel element of the component A can be 99.0 wt % or more, and the content of the nickel element of the component B can be in the range of 90 wt % to 99.0 wt %.

In the nickel particle composition of the invention, the content of the nickel element of the component A can be 99.0 wt % or more, the content of the nickel element of the component B can be in the range of 90 wt % to 99.0 wt %, and relative to the total metal content, the content of the component C can be in the range of 0.1 wt % to 2.5 wt %.

In the nickel particle composition of the invention, the content of the nickel element of the component A can be 99.0 wt % or more, the content of the nickel element of the component B can be in the range of 90 wt % to 99.0 wt %, and relative to the total metal content, the content of the component C can be in the range of 0.3 wt % to 1.5 wt %.

The bonding material of the invention contains a nickel particle composition, and the content of the nickel particle composition is in the range of 70 wt % to 96 wt %.

The bonding material of the invention further contains an organic solvent having a boiling point in the range of 100° C. to 300° C., wherein the content of the organic solvent is in the range of 4 wt % to 30 wt %.

In the bonding material of the invention, relative to all of the organic solvent, the organic solvent can contain at least one selected from the group consisting of 1-undecanol and tetradecane in the range of 15 wt % to 50 wt %.

The bonding method of the invention includes placing any one of the bonding materials between members to be bonded and performing heating at a temperature in the range of 200° C. to 400° C. in a reductive gas environment containing a reductive gas to form a bonding layer between the members to be bonded.

Based on the nickel particle composition, the bonding material, and the bonding method of the invention, a noble metal such as silver is not needed, moreover, even if pressure is not applied to the members to be bonded, sufficient bonding strength can still be obtained.

DESCRIPTION OF THE EMBODIMENTS

In the following, implementations of the invention are described.

[Nickel Particle Composition]

The nickel particle composition of the invention contains the following component A to component C, wherein the weight ratio of the component A to the component B (component A:component B) is in the range of 30:70 to 70:30.

A) A nickel particle having an average particle size in the range of 0.5 μm to 20 μm obtained via a laser diffraction/scattering method and containing 50 wt % or more of a nickel element;

B) a nickel fine particle having an average primary particle size in the range of 30 nm to 200 nm observed via a scanning electron microscope and containing 50 wt % or more of a nickel element; and C) an organic binder in the range of 0.1 wt % to 2.5 wt % relative to the total metal content.

(Component A: Nickel Particles)

From the perspective of inhibiting volume contraction when the bonding layer is formed by heating, the average particle size of the nickel particles of the component A obtained by a laser diffraction/scattering method is set in the range of 0.5 μm to 20 μm. If the average particle size of the nickel particles of the component A is less than 0.5 μm, then volume contraction is greater when the bonding layer is formed by heating, and bonding between the bonded bodies is insufficient. Moreover, if the average particle size of the nickel particles of the component A exceeds 20 μm, then coatability on the bonded bodies is degraded or the thickness of the bonding layer is difficult to adjust.

Moreover, the content of the nickel element can be suitably selected as long as the nickel particles of the component A corresponds to the object of use thereof, and relative to all of the metal element, the amount of the nickel element is preferably set to 50 wt % or more, more preferably set to 75 wt % or more, and still more preferably set to 90 wt % or more. To sufficiently display the effects of the invention, the nickel particles of the component A preferably contain 99.0 wt % or more of the nickel element. For instance, setting the nickel element content of the nickel particles of the component A to 99.0 wt % or more is based on the nickel element amount in a regular commercial nickel particle. For the other components used as elements other than nickel, the nickel particles of the component A can also contain metal impurities other than oxygen or carbon. Moreover, the sinterability of the nickel particles is affected by the traits of the surface or the surface layer portion of the nickel particles, and therefore from this perspective, the nickel particles of the component A can have a multilayer structure such as a core-shell structure containing a shell (shell portion) containing nickel element and a core (center portion) formed by dissimilar metals, or a structure for which the nickel element concentration of the surface layer portion of the nickel particles is higher than the concentration of the center portion and the concentration of the dissimilar metals is higher in the center portion. When such as structure is adopted, relative to all of the metal element of the surface layer portion, the nickel particles of the component A preferably contain 50 wt % or more of the nickel element, more preferably contain 75 wt % or more of the nickel element, and still more preferably contain 90 wt % or more of the nickel element. Therefore, a gradient can be set for the concentration of the nickel element and the surface layer portion of the nickel particles can be set to high concentration, and therefore relative to all of the metal element, the content of the nickel element can also be set to about 10 wt %.

The nickel particles of the component A can be used regardless of the manufacturing method thereof. The nickel particles of the component A can preferably adopt, for instance, commercial products made by Kanto Chemical Industry Corporation (product name: nickel (powder)) or Sigma-Aldrich Japan Associates (product name: Nickel).

(Component B: Nickel Fine Particles)

The average primary particle size of the nickel fine particles of the component B obtained by SEM observation is in the range of 30 nm to 200 nm. For instance, when sintering is performed by heating the nickel particle composition of the invention at a temperature of 300° C., the average primary particle size of the nickel fine particles of the component B is preferably in the range of 30 nm to 100 nm. Moreover, when sintering is performed by heating the nickel particle composition of the invention at a temperature of 350° C., the average primary particle size of the nickel fine particles of the component B is preferably in the range of 30 nm to 160 nm. If the average primary particle size of the nickel fine particles of the component B is less than 30 nm, then the nickel fine particles are readily agglomerated, and uniform mixing with the nickel particles of the component A is difficult. Moreover, if the average primary particle size of the nickel fine particles of the component B exceeds 200 nm, then the sintering capability between the nickel fine particles or the nickel fine particles and the nickel particles of the component A is insufficient, such that the bonding strength is reduced. Moreover, in the present specification, the average particle size of the primary particles of the nickel fine particles of the component B contains the value used in the examples, which is obtained by taking pictures of the samples using a field emission-scanning electron microscope (FE-SEM) and calculating the area of each of 200 randomly selected pictures and using the particle size of converted true balls as the number of benchmarks.

Moreover, the content of the nickel element can be suitably selected as long as the nickel fine particle of the component B corresponds to the object of use thereof, and relative to all of the metal element, the nickel fine particle preferably contains an amount of 50 wt % or more of the nickel element, more preferably contains an amount of 75 wt % or more of the nickel element, and still more preferably contains an amount in the range of 90 wt % to 99.0 wt % of the nickel element. For instance, when a nickel fine particle made by a wet reduction method or a nickel fine particle treated in distributed processing is used as the component B, if the average primary particle size of the nickel fine particles is in the range of 30 nm to 200 nm, then the content of the nickel element is the value above in the presence of carbon or passive oxygen covering the surface. Moreover, the sinterability of the nickel fine particle is affected by the traits of the surface or the surface layer portion of the nickel fine particle, and therefore from this perspective, the nickel fine particle of the component B can have a multilayer structure such as a core-shell structure containing a shell (shell portion) containing a nickel element and a core (center portion) formed by dissimilar metals, or a structure for which the nickel element concentration of the surface layer portion of the nickel fine particle is higher than the concentration of the center portion and the concentration of the dissimilar metals is higher in the center portion. When such as structure is adopted, relative to all of the metal element of the surface layer portion, the nickel fine particle of the component B preferably contains 50 wt % or more of the nickel element, more preferably contains 75 wt % or more of the nickel element, and still more preferably contains 90 wt % or more of the nickel element. Therefore, a gradient can be set for the concentration of the nickel element and the surface layer portion of the nickel particle can be set to high concentration, and therefore relative to all of the metal element, the content of the nickel element can also be set to about 10 wt %.

Moreover, the nickel fine particle of the component B can also contain a metal other than nickel, but the content thereof is preferably set in an amount in the range of 1 wt % to 10 wt %. The metal other than nickel can include, for instance, a metal element such as a base metal such as tin, titanium, cobalt, copper, chromium, manganese, iron, zirconium, tungsten, molybdenum, or vanadium or a noble metal such as gold, silver, platinum, palladium, iridium, osmium, ruthenium, rhodium, or rhenium. One or two or more of the above can be used.

Moreover, when a nickel fine particle made by a wet reduction method or a nickel fine particle treated in distributed processing is used as the nickel fine particle of the component B, a non-metal element such as an oxygen element or a carbon element can also be used. When the nickel fine particle of the component B contains a carbon element, the content thereof is, for instance, in the range of 0.3 wt % to 2.5 wt %, preferably in the range of 0.5 wt % to 2.0 wt %. The carbon element is from an organic compound present on the surface of the nickel fine particle, and as a result the dispersibility of the nickel fine particle can be increased. Therefore, if the content of the carbon element in the nickel fine particle of the component B is less than 0.3 wt %, then sufficient dispersibility sometimes cannot be obtained, and in the case of over 2.5 wt %, residual carbon may be formed due to carbonization after calcination, and the conductivity of the bonding layer is reduced. Moreover, when the nickel fine particle of the component B contains an oxygen element, the content thereof is, for instance, in the range of 0.7 wt % to 7.5 wt %, preferably in the range of 1.0 wt % to 2.0 wt %.

The nickel fine particle of the component B can be used regardless of the manufacturing method thereof, but is preferably obtained by the following known method: a nickel fine particle is precipitated by performing heat reduction on the nickel ion using a wet reduction method from a mixture containing nickel salt and organic amine. Here, an example of the manufacturing method of the nickel fine particle using a wet reduction method is described.

The manufacture of the nickel fine particle using a wet reduction method can include the following step 1 and step 2:

Step 1) a complexation reaction solution forming step of heating a mixture containing nickel carboxylate and primary amine to a temperature in the range of 100° C. to 165° C. to obtain a complexation reaction solution;

and,

Step 2) a nickel fine particle slurry forming step of heating the complexation reaction solution to a temperature of 170° C. or more via microwave irradiation to reduce the nickel ion in the complexation reaction solution to obtain a slurry of a nickel fine particle covered by a primary amine.

Step 1) Complexation Reaction Solution Forming Step:
(Nickel Carboxylate)

The type of the carboxylic acid is not limited in the nickel carboxylate (nickel salt of carboxylic acid), and the carboxylic acid can be, for instance, monocarboxylic acid having 1 carboxyl group. Moreover, the carboxylic acid can also be carboxylic acid having 2 or more carboxyl groups. Moreover, the carboxylic acid can also be acyclic carboxylic acid or cyclic carboxylic acid. The nickel carboxylate can also be non-cyclic monocarboxylic acid nickel. In the non-cyclic monocarboxylic acid nickel, nickel formate, nickel acetate, nickel propionate, nickel oxalate, and nickel benzoate . . . etc. are preferred. By using the non-cyclic monocarboxylic acid nickels, uneven shape of the resulting nickel fine particle can be inhibited such that an even shape is readily obtained. The nickel carboxylate can be an anhydride or a hydrate.

(Primary Amine)

Primary amine can form a complex with a nickel ion such that reduction capacity to the nickel complex (or nickel ion) can be effectively displayed. Moreover, since the steric hindrance of secondary amine is large, the issue of hindrance to the good forming of the nickel complex exists and tertiary amine does not have the reduction capacity of nickel ion, and therefore neither can be used alone. However, under the premise that primary amine is used, the amines can be used together in the range of not causing hindrance to the shape of the resulting nickel fine particle. The primary amine is not particularly limited as long as it can form a complex with nickel ion and is solid or liquid at room temperature. Here, room temperature refers to 20° C.+15° C. Primary amine in liquid state at room temperature also acts as an organic solvent when forming a nickel complex. Moreover, primary amine in solid state at room temperature can be used as long as it is liquid when heated to 100° C. or more or is dissolved using an organic solvent.

The primary amine can also be an aromatic primary amine, but from the perspective of the readiness of forming the nickel complex in the reaction solution, an aliphatic primary amine is preferred. In the aliphatic primary amine, the particle size of the resulting nickel fine particle can be controlled by adjusting the length of the carbon chain thereof, which is particularly beneficial to the manufacture of nickel fine particle having an average primary particle size in the range of 30 nm to 200 mm From the perspective of controlling the particle size of the nickel fine particle, the aliphatic primary amine is preferably about $C_6$ to $C_{20}$. The greater the carbon number, the smaller the particle size of the resulting nickel fine particle. The amine can include, for instance: octylamine, trioctylamine, dioctylamine, hexadecylamine, dodecylamine, tetradecylamine, stearylamine, oleyl amine, myristylamine, or laurylamine. For instance, oleyl amine exists in liquid state under the temperature condition in the forming process of the nickel fine particle, and therefore a uniform solution is obtained and reaction can be performed efficiently.

The primary amine acts as a surface modifier during the forming of the nickel fine particle, and therefore secondary agglomeration can be inhibited after the primary amine is removed. Moreover, from the perspective of the readiness of the processing operation in the cleaning step of separating the solid content of the nickel fine particle formed after the reduction reaction from, for instance, the solvent or unreacted primary amine, the primary amine is preferably a liquid at room temperature. Moreover, from the perspective of the readiness of reaction control when the nickel complex is reduced to obtain the nickel fine particle, the primary amine preferably has a boiling point higher than the reduction temperature. That is, in the aliphatic primary amine, the boiling point is preferably 180° C. or more, more preferably 200° C. or more, and in addition, $C_9$ or more is preferred. Here, the boiling point of $C_9$ aliphatic amine $C_9H_{21}N$ (nonylamine) is 201° C. Relative to 1 mol of nickel, the amount of the primary amine is preferably 2 mol or more, more preferably 2.2 mol or more, and ideally is 4 mol or more. If the amount of the primary amine is less than 2 mol, then the particle size of the resulting nickel fine particle is difficult to control, and the particle size is likely to not be uniform. Moreover, a particular upper limit of the amount of the primary amine does not exist, but from the perspective of productivity, is preferably set to 20 mol or less.

(Organic Solvent)

In step 1, to more efficiently perform the reaction in the uniform solution, an organic solvent different than the primary amine can also be added. When an organic solvent is used, the organic solvent can be mixed with nickel carboxylate and primary amine together, but if the organic solvent is added after the complexation of the nickel carboxylate and the primary amine by mixing the two, then the primary amine is efficiently coordinated on the nickel atom, which is preferred. The organic solvent is not particularly limited as long as it does not hinder the complexation of the primary amine and nickel ion, and the following can be used: $C_4$ to $C_{30}$ ether organic solvent, $C_7$ to $C_{30}$ saturated or unsaturated hydrocarbon organic solvent, and $C_8$ to $C_{18}$ alcohol organic solvent . . . etc. Moreover, from the perspective of application under the heating condition using microwave irradiation, the organic solvent used preferably has a boiling point of 170° C. or more, and more preferably has a boiling point in the range of 200° C. to 300° C. Specific examples of the organic solvent can include, for instance: tetraethylene glycol and n-octyl ether.

The complexation reaction can also be performed at room temperature, but to perform a sufficient complexation reaction with better efficiency, the complexation reaction is performed while heated to a temperature in the range of 100° C. to 165° C. For instance, in the case that hydrate of nickel carboxylate such as nickel formate dihydrate or nickel acetate tetrahydrate is used as the nickel carboxylate, heating is particularly beneficial. By setting the heating temperature to preferably over 100° C., more preferably 105° C. or more, ligand substitution reaction of ligand water and primary amine coordinated on the nickel carboxylate is performed at high efficiency, and water molecules used as the complex ligand can be dissociated, such that the water can be discharged out of the system. As a result, a complex can be formed with high efficiency. For instance, nickel formate dihydrate adopts a complex structure in which 2 ligand waters are present at room temperature and 2 formate ions used as bidentate ligands, and therefore to perform complexation via the ligand substitution of the 2 ligand waters and the primary amine at high efficiency, the water molecules used as the complex ligand are preferably dissociated by heating at a temperature higher than 100° C. Moreover, from the perspective of truly separating from the subsequent nickel complex (or nickel ion) using the process of heat reduction of microwave irradiation and completing the complexation reaction, the heat treatment in the complexation reaction of the nickel carboxylate and primary amine is set to the upper limit temperature or less, preferably set to 160° C. or less, and more preferably set to 150° C. or less.

The heating time can be suitably decided in correspondence to the heating temperature or the content of each raw material, but from the perspective of completing the complexation reaction, is preferably set to 10 minutes or more. The upper limit of the heating time is not particularly limited, but from the perspective of reducing energy consumption and process time, a long time is not beneficial to the heat treatment. Moreover, the heating method is not particularly limited, and heating can be performed by a heat medium such as an oil bath or microwave irradiation.

When the solution obtained by mixing nickel carboxylate and primary amine in an organic solvent is heated, the complexation reaction of the nickel carboxylate and primary amine can be confirmed by the change in color of the solution. Moreover, the complexation reaction can be confirmed, for instance, by the following method: the maximum absorption wavelength of the absorption spectrum observed in the wavelength range of 300 nm to 750 nm is measured using a UV/visible light absorption spectrum measuring device and shift (maximum absorption wavelength shift to 600 nm) of the complexation reaction solution of the maximum absorption wavelength (such as the maximum absorption wavelength of the nickel formate dihydrate is 710 nm and the maximum absorption wavelength of the nickel acetate tetrahydrate is 710 nm) relative to the raw material is observed.

After the complexation of nickel carboxylate and primary amine is performed, as described below, the resulting reaction solution is heated via microwave irradiation to reduce the nickel ion of the nickel complex, the carboxylate ion coordinated on the nickel ion is broken down at the same time, and lastly a nickel fine particle containing nickel having an oxidation number of 0 is formed. In general, nickel carboxylate is insoluble under the condition other than using water as the solvent, and the solution containing nickel carboxylate needs to be made into a uniform reaction solution in the pre-stage of heating reduction reaction using microwave irradiation. In comparison, the primary amine used in the present implementation can be considered as liquid under the usage temperature condition and is liquefied by being coordinated on the nickel ion to form a uniform reaction solution.

Step 2) Nickel Fine Particle Slurry Ruining Step:

In the present step, the complexation reaction solution obtained from the complexation reaction of nickel carboxylate and primary amine using microwave irradiation is heated to a temperature of 170° C. or more such that the nickel ion in the complexation reaction solution is reduced to obtain a nickel fine particle slurry covered by primary amine. From the perspective of inhibiting the uneven shape of the resulting nickel fine particle, the heating temperature using microwave irradiation is preferably set to 180° C. or more, and more preferably set to 200° C. or more. The upper limit of the heating temperature is not particularly set, but from the perspective of efficient processing, is preferably set to 270° C. or less. Moreover, the wavelength of the microwave is not particularly limited, and is, for instance, 2.45 GHz. Moreover, the heating temperature can be suitably adjusted by, for instance, the type of the nickel carboxylate or the use of an additive promoting nuclear generation of the nickel fine particle.

In the present step, the microwave permeates the reaction solution, and therefore uniform heating can be performed and energy can be directly provided to the medium. As a result, rapid heating can be performed. Accordingly, the whole reaction solution can uniformly reach the desired temperature, and the processes of reduction, nuclear generation, and nuclear growth of the nickel complex (or nickel ion) can all occur in the entire solution at the same time, and the result is that monodisperse particles having a small particle size distribution can be readily formed in a short time.

To form nickel fine particles having a uniform particle size, a nickel complex needs to be uniformly and sufficiently formed in the complexation reaction solution forming step (step of forming a nickel complex) of step 1, and in the nickel fine particle slurry forming step of step 2, it is needed that simultaneous generation/growth of the core of the nickel (0 valence) formed by the reduction of the nickel complex (or nickel ion) is performed. That is, the heating temperature of the complexation reaction solution forming step is adjusted in the specific range, and is confirmed to be lower than the heating temperature of the microwave in the nickel fine particle slurry forming step, and therefore particles having uniform particle size and shape are readily formed. For instance, if the heating temperature in the complexation reaction solution forming step is too high, then the issue in which the forming of particles having uniform shape in the nickel fine particle slurry forming step is difficult exists due to the simultaneous occurrence of the forming of the nickel complex and the reduction reaction toward nickel (0 valence). Moreover, if the heating temperature of the nickel fine particle slurry forming step is too low, then the reduction reaction toward nickel (0 valence) is slower and core generation is less, and therefore not only are particles bigger, the yield of the nickel fine particles is also poor.

After the nickel fine particle slurry obtained by heating using microwave irradiation is, for instance, separated by being left to stand and the supernatant is removed, a suitable solvent is used to perform cleaning and the nickel fine particle slurry is dried to obtain nickel fine particles. In the nickel fine particle slurry forming step, the organic solvent can be added as needed. Moreover, as described above, primary amine used in the complexation reaction is preferably directly used as the organic solvent.

Via the method, nickel fine particles having an average primary particle size in the range of 30 nm to 200 nm can be prepared.

(Component C: Organic Binder)

The organic binder of the component C has, for instance, the following effects: the nickel particles of the component A and the nickel fine particles of the component B are connected such that the two are close such that the bonding layer is changed into blocks. In the nickel particle composition of the present implementation, micron-sized particles and nano-sized fine particles are included, and therefore in comparison to uniform particles, agglomeration does not readily occur due to the difference in particle size, and connecting points among the particles are few. If an organic binder of the component C is added thereto, then connection among the particles is extensively formed. Moreover, calcination is performed by maintaining the extensive connection state of the nickel particles of the component A and the nickel fine particles of the component B via the organic binder of the component C to obtain a blocky bonding layer having high bonding strength.

The organic binder of the component C is not particularly limited as long as it can be dissolved in an organic solvent, and examples can include, for instance: a thermosetting resin such as phenol resin, epoxy resin, unsaturated polyester resin, urea resin, or melamine resin, and a thermoplastic resin such as polyethylene resin, acrylic resin, methacrylic resin, nylon resin, acetal resin, or polyvinyl acetal resin. Among those, polyvinyl acetal resin is preferred, in particular polyvinyl acetal resin having an acetal group unit, an acetyl unit, and a hydroxyl unit in the molecules.

To inhibit precipitation of the nickel particles of the component A and the nickel fine particles of the component B and maintain sufficient dispersion state, the organic binder of the component C preferably has a molecular weight of, for instance, 30000 or more, and more preferably 100000 or more.

The organic binder of the component C can preferably include, for instance, a commercial product such as polyvinyl acetal resin (product name: S-LEC BH-A) made by Sekisui Chemical Industry Company.

(Mixing Ratio)

The weight ratio of the component A and the component B (component A:component B) of the nickel particle composition is in the range of 30:70 to 70:30. If the ratio of the nickel particles of the component A is higher than the range, then unsintered nickel particles are increased, and therefore the strength of the bonding layer is insufficient. Moreover, if the ratio of the nickel particles of the component A is less than the range, then the overall volume contraction of the bonding layer is increased, and sufficient bonding strength also cannot be obtained in that case.

Moreover, relative to the total metal content in the composition, the amount of the organic binder of the component C in the nickel particle composition is in the range of 0.1 wt % to 2.5 wt %, preferably in the range of 0.3 wt % to 1.5 wt %, and more preferably 0.5 wt % to 1.2 wt %. Here, "total metal content" refers to the total weight of the nickel particles of the component A and the nickel fine particles of the component B. If the amount of the organic binder of the component C exceeds the range, then the sintering of the nickel particles of the component A and the nickel fine particles of the component B is insufficient, and if lower than the range, then mixing effect cannot be achieved.

Other than the component A to the component C, the nickel particle composition of the present implementation can contain, for instance, scale-like or wire-like non-spherical nickel or a carbon material such as carbon nanotube in a level of not hindering the sintering as any component.

(Bonding Material)

The bonding material of the present implementation contains the nickel particle composition. The bonding material of the present implementation can further contain an organic solvent having a boiling point in the range of 100° C. to 300° C. From a practical perspective, the boiling point of the solvent in the bonding material is preferably in the range of 150° C. to 260° C. If the boiling point of the organic solvent used is less than 100° C., then unsatisfactory long-term stability tends to occur, and if over 300° C., then volatilization does not occur during heating, and residual carbon is formed in the bonding layer, such that sintering of particles or the forming of intermetallic compounds tends to be hindered. The bonding material is preferably concentrated after an organic solvent having a high boiling point is added to form a paste.

The content of the nickel particle composition in the bonding material is, for instance, in the range of 70 wt % to 96 wt %, preferably in the range of 85 wt % to 95 wt %. If the content of the nickel particle composition is less than 70 wt %, then the thickness of the bonding layer is sometimes thinner. For instance, repeated coating needs to be performed such that uniform coating is not achieved. Moreover, sufficient bonding strength sometimes cannot be obtained. Moreover, if the content of the nickel particle composition exceeds 96 wt %, then fluidity of the paste is sometimes lost, such that coating is difficult . . . etc. and usability is reduced.

The solvent having a boiling point in the range of 100° C. to 300° C. can include, for instance, alcohol, aromatic, hydrocarbon, ester, ketone, or ether solvent. Examples of the alcohol solvent can include, for instance, $C_7$ or more aliphatic alcohol such as 1-heptanol, 1-octanol, 2-octanol, 2-ethyl-1-hexanol, 1-nonanol, 3,5,5-trimethyl-1-hexanol, 1-decanol, or 1-undecanol, polyol such as ethylene glycol, diethylene glycol, propylene glycol, trimethylene glycol, 1,2-butanediol, 1,3-butanediol, 1,4-butanediol, tetramethylene glycol, or methyl triglycol, terpineol such as α-terpineol, β-terpineol, or γ-terpineol, or alcohol having an ether group such as ethylene glycol monopropyl ether, ethylene glycol monobutyl ether, methyl methoxy butanol, diethylene glycol, dipropylene glycol, 2-phenoxyethanol, or 1-phenoxy-2-propanol. Moreover, the hydrocarbon solvent can include, for instance: octane, nonane, decane, undecane, dodecane, tridecane, tetradecane, or pentadecane. Among those, 1-undecanol and tetradecane are preferred, and relative to all of the organic solvent, 1-undecanol and/or tetradecane are/is preferably included in the range of 15 wt % to 50 wt %. When 1-undecanol and/or tetradecane is used, relative to all of the organic solvent, terpineol is preferably used in the range of 50 wt % to 85 wt %.

The content of the organic solvent in the bonding material of the present implementation is, for instance, in the range of 4 wt % to 30 wt %, preferably in the range of 5 wt % to 15 wt %. If the content of the organic solvent in the bonding material is less than 4 wt %, then fluidity is sometimes reduced such that the usability of the bonding material is reduced. Moreover, if the content of the organic solvent exceeds 30 wt %, then, for instance, repeated coating needs to be performed such that uniform coating is not achieved. Moreover, sufficient bonding strength sometimes cannot be obtained.

Other than the components, the bonding material of the present implementation can contain, for instance, a thickening agent, a thixotropic agent, a leveling agent, or a surfactant as any component.

(Bonding Method)

In the bonding method of the present implementation, the bonding material is located between members to be bonded, and heating is performed in a reductive gas environment containing a reductive gas at a temperature in the range of, for instance, 200° C. to 400° C., preferably 250° C. to 400° C., and more preferably 250° C. to 350° C. to form a bonding layer between the members to be bonded. Therefore, to perform sintering between the nickel fine particles and between the nickel fine particles and the nickel particles, the metal surfaces of the nickel fine particles and the nickel particles need to be exposed. The heating temperature causing volatilization or decomposition to the organic substance present on the nickel fine particle surface is, for instance, 200° C. or more, preferably 250° C. or more, and as a result, by heating in a reductive gas environment, the passive layer on the surfaces of the nickel fine particles and the nickel particles can be removed. Moreover, if the heating temperature exceeds 400° C., then damage sometimes occurs around the semiconductor devices used as the members to be bonded.

The bonding method of the present implementation can contain, for instance, the following steps: a paste bonding material is coated on the bonded surface at one side or two sides of a pair of members to be bonded (coating step); and the bonded surfaces are bonded to each other and heated in a temperature range of, for instance, 200° C. to 400, preferably 250° C. to 400° C., and more preferably 250° C. to 350° C. to sinter the bonding material (calcination step).

In the coating step of coating the bonding material, spray coating, inkjet coating, or printing . . . etc. can be used. The bonding material can correspond to the object and be coated into any shape such a pattern, an island, a mesh, a grid, or a strip. In the coating step, the bonding material is preferably coated by changing the thickness of the coating film to the range of 50 μm to 200 μm. Coating is performed at this thickness, and therefore the defects of the bonding portion can be reduced, such that increase in resistance or decrease in bonding strength can be prevented.

Moreover, the calcination step can be performed by applying pressure on the members to be bonded at, for instance, 10 MPa or less, preferably 1 MPa or less or more preferably without applying pressure. The calcination step can be simplified and moreover, damage caused by applying pressure to the members to be bonded can be reduced.

The bonding method of the present implementation can be applied in, for instance, the bonding of Si and SiC semiconductor materials or the manufacturing process of electronic components. Here, the electronic components can mainly include, for instance, semiconductor devices and energy conversion module components. When the electronic components are semiconductor devices, the bonding method can be applied in the bonding between, for instance, the back of the semiconductor devices and the substrate, the semiconductor electrode and the substrate electrode, the semiconductor electrode and the semiconductor electrode, or power devices or power modules and radiating components.

When electronic components are bonded, to increase bonding strength, a contact metal layer of a material such as Au, Cu, Pd, Ni, Ag, Cr, Ti or an alloy thereof is preferably disposed at one side or two sides of the bonded surfaces beforehand. Moreover, when the material of the bonded surfaces is SiC or Si or an oxide film of the surfaces, a contact metal layer of a material such as Ti, TiW, TiN, Cr, Ni, Pd, V, or an alloy thereof is preferably first disposed.

Moreover, the bonding method of the present implementation can also be used in the bonding of, for instance, metal materials. In particular, bonding is preferably performed at low temperature in the case that degradation to the base material is observed at heat effected portion when bonding is performed using wax or soldering. Moreover, the bonding method of the present implementation is also suitable for the bonding of, for instance, hardened steel, stainless steel, a strengthened metal material obtained by hardening, or an inorganic material or a metal material degraded by thermal oxidation or thermal strain. The bonded body can include, for instance, a pipe, a board, a connector, a rod, a wire, or a bolt, but is not limited to these bonded bodies.

Effects

Figure 1:
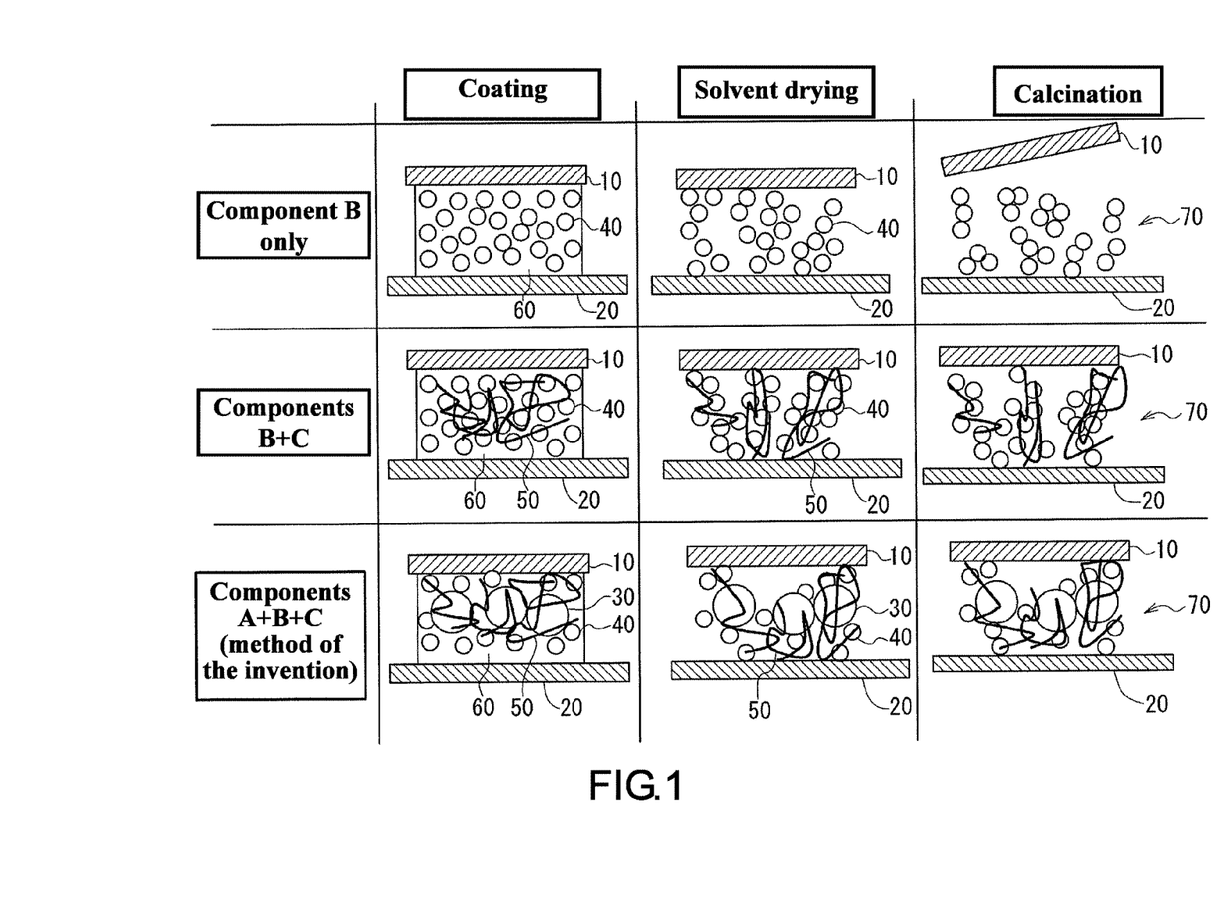
FIG. 1 is a figure schematically describing the effects of the invention in comparison to prior art.

Next, the effects of the invention are described with reference to FIG. 1. FIG. 1 schematically shows the states of the bonding portion of each stage of coating, solvent drying, and calcination when a member to be bonded 10 and a member to be bonded 20 are bonded using three methods including the method of the invention. In FIG. 1, reference numeral 30 refers to the nickel particles of the component A, reference numeral 40 refers to the nickel fine particles of the component B, reference numeral 50 refers to the organic binder of the component C, reference numeral 60 refers to the organic solvent, and reference numeral 70 refers to the bonding layer.

The upper portion of FIG. 1 is the case in which the bonding material containing the nickel fine particles 40 of the component B is used, the middle portion of FIG. 1 is the case in which the bonding material containing the nickel fine particles 40 of the component B and the organic binder 50 of the component C is used, and the lower portion of FIG. 1 is the case in which the bonding material of the invention containing the nickel particles 30 of the component A, the nickel fine particles 40 of the component B, and the organic binder 50 of the component C is used.

As shown in the upper portion of FIG. 1, when a bonding material containing only the nickel fine particles 40 of the component B is used, the particle size is consistent on the nano scale, and therefore the bonding material is uniformly dispersed during coating. During solvent drying and calcination, the agglomerates between a small number of particles approaching one another based on the agglomeration effect of the nickel fine particles 40 of the component B becomes a basic unit and the bonding layer 70 is formed. However, the bonding between the particles inside the agglomerates is weak, and therefore the bonding layer 70 is readily split into small pieces, and peeling of the member to be bonded 10 readily occurs.

The middle portion of FIG. 1 shows that, when the bonding material containing the nickel fine particles 40 of the component B and the organic binder 50 of the component C is used, the particle size is also consistent on the nano scale, and therefore the bonding material is uniformly dispersed during coating. During solvent drying and calcination, other than the agglomeration effect of the nickel fine particles 40 of the component B, the bonding layer 70 is formed by the aggregates of the nickel fine particles 40 of the component B as a basic unit by the linking effect produced by the organic binder 50 of the component C. However, the linking effect produced by the organic binder 50 of the component C is limited to strengthening the linking inside the aggregates of the nickel fine particle 40 of the component B, the linking of the aggregates is sparse, and therefore the bonding layer 70 is readily split into pieces in units of aggregates, and sufficiently high bonding strength cannot be obtained.

As shown in the lower portion of FIG. 1, when a bonding material containing the nickel particles 30 of the component A, the nickel fine particles 40 of the component B, and the organic binder 50 of the component C is used, micron-sized particles are located between nano-sized particles, and therefore a large number of gaps is present between the particles, and the bonding material is dispersed in a slightly uneven manner during coating. However, during solvent drying and calcination, the presence of the nickel particles 30 of the component A hinders the agglomeration of the nickel fine particles 40 of the component B, and therefore the linking effect produced by the organic binder 50 of the component C has a dominant position such that extensive linking occurs, and an integral blocky bonding layer 70 is formed. In comparison to the bonding layer 70 in units of agglomerates (upper portion) or aggregates (middle portion), the bonding layer 70 integrally formed by the method of the invention as described does not readily split, and very high bonding strength can be obtained.

EXAMPLES

Examples are provided below, and the features of the invention are more specifically described. However, the invention is not limited to the examples. Moreover, in the following examples, unless otherwise stated, the various measurements and evaluations are performed by the following methods.

[Measurement of Average Particle Size of Component A]

The measurement of the average particle size of the nickel particles of the component A was performed via a laser diffraction/scattering method. LMS-30 made by Seishin Enterprise Co., Ltd. was used for the device, and water was used as the dispersion medium and measurement was performed in a flow cell.

[Measurement of Average Particle Size of Component B]

The measurement of the average particle size of the component B (nickel fine particles) was made by taking pictures of the samples using a field emission-scanning electron microscope (FE-SEM) and calculating the area of each of 200 randomly selected pictures and then calculating the average particle size of the primary particles by using the particle size of converted true balls as the number of benchmarks.

[Calcination Method 1]

A small inert gas oven (made by Koyo Thermo Systems Corporation, product name: KLO-30NH) was used for the calcination of the samples for sintering test, and after a mixed gas of 3% hydrogen and 97% nitrogen was introduced at a rate of 5 L/min while the temperature was increased from room temperature to 250° C., 300° C., or 350° C. at a heating rate of 5° C./min, the specific temperature was held for 1 hour. Next, after the temperature was lowered to 50° C. over 400 minutes, the samples were left to stand until they reached room temperature. Next, pressure was not applied to the samples in the calcination of the samples for the sintering test. That is, calcination was performed without applying pressure.

[Evaluation 1 of Shear Strength]

After the samples were coated on a gold-plated copper substrate (width: 10 mm, length: 10 mm, thickness: 1.0 mm) using a stainless steel mask (mask width: 2.0 mm, length: 2.0 mm, thickness: 0.1 mm) to form a coating film, a silicon die (width: 2.0 mm, length: 2.0 mm, thickness: 0.40 mm) was mounted on the coating film to perform calcination. The shear strength of the resulting bonding samples (thickness of bonding layer: about 50 μm) was measured by a bonding strength test machine (made by Dage•Japan Corporation, product name: bonding tester 4000). The bonding test tool was pressed at a height of 50 μm from the substrate and a tool speed of 100 μm/sec from the side of the die, and the shear strength was set to be the load at the point of shear fracture of the bonding portion. Next, gold-plated copper substrates were formed by coating Ni/Au on the surface of a Cu substrate (thickness: 1.0 mm) respectively at thicknesses of 4 μm/40 nm to 50 nm, and the silicon die was formed by sputtering Au on the bonding surface of a Si substrate (thickness: 0.40 mm).

[SEM Observation of Bond Sample Cross-Section]

After the bond samples made in the same manner as shear strength evaluation 1 were embedded using an epoxy resin, cross-section processing was performed and observation was made by an FE-SEM.

Synthesis Example 1

100.1 parts by weight of nickel acetate tetrahydrate was added to 642 parts by weight of oleyl amine and the mixture was heated at 150° C. for 20 minutes under a nitrogen flow to dissolve nickel acetate and obtain a complexation reaction solution. Next, 492 parts by weight of oleyl amine was added in the complexation reaction solution, and the mixture was heated using a microwave at 250° C. for 5 minutes to obtain a nickel fine particle slurry 1.

After the nickel fine particle slurry 1 obtained in synthesis example 1 was separated by being left to stand and the supernatant was removed, cleaning was performed using toluene and methanol, and then drying was peformed in a vacuum dryer at a constant temperature of 60° C. for 6 hours to obtain a nickel fine particle 1 (average primary particle size: 92 nm).

[Preparation of Slurry Solution 1]

100 parts by weight of the nickel fine particle slurry 1 obtained in synthesis example 1 was separated and collected and 20 parts by weight of octanoic acid was added thereto. After stirring for 15 minutes, washing was performed using toluene to prepare a slurry solution 1 (solid content concentration: 68.1 wt %).

Example 1

[Preparation of Paste 1]

125 parts by weight of the slurry solution 1 was separated and collected, and 57 parts by weight of the nickel particle 1 (made by Kanto Chemical Industry Co., Ltd., product name: nickel (powder), average particle size obtained by a laser diffraction/scattering method: 9.8 μm, content of nickel element: 99 wt % or more relative to the entire nickel particle), 9.4 parts by weight of α-terpineol (made by Wako Pure Chemical Industrial Co., Ltd., boiling point: 220° C.), 2.0 parts by weight of tetradecane (made by Wako Pure Chemical Industrial Co., Ltd., boiling point: 254° C.), and 0.78 parts by weight of the binder resin 1 (made by Sekisui Chemical Co., Ltd., product name: S-LEC BH-A) were mixed therein, and concentration was performed using an evaporator at 60° C. and 100 hPa to prepare 126 parts by weight of a paste 1 (solid content concentration: 92.1 wt %).

A bonding test sample was manufactured at 350° C. from the paste 1 based on [calcination method 1] and [evaluation 1 of shear strength] and the shear strength was evaluated. The result was 16.0 MPa and sufficient strength was obtained. The results are shown in Table 1.

Example 2

[Preparation and Shear Strength Evaluation of Paste 2]

114 parts by weight of the slurry solution 1 was separated and collected, and 78 parts by weight of the nickel particle 1, 10.7 parts by weight of α-terpineol, 2.3 parts by weight of tetradecane, and 0.78 parts by weight of the binder resin 1 were mixed therein, and concentration was performed using an evaporator at 60° C. and 100 hPa to prepare 170 parts by weight of a paste 2 (solid content concentration: 91.8 wt %).

A bonding test sample was manufactured at 350° C. from the paste 2 based on [calcination method 1] and [evaluation 1 of shear strength] and the shear strength was evaluated. The result was 49.0 MPa and good strength was obtained. The results are shown in Table 1.

Example 3

[Preparation and Shear Strength Evaluation of Paste 3]

116 parts by weight of the slurry solution 1 was separated and collected, and 119 parts by weight of the nickel particle 1, 13.2 parts by weight of α-terpineol, 2.9 parts by weight of tetradecane, and 1.1 parts by weight of the binder resin 1 were mixed therein, and concentration was performed using an evaporator at 60° C. and 100 hPa to prepare 215 parts by weight of a paste 3 (solid content concentration: 92.0 wt %).

A bonding test sample was manufactured at 350° C. from the paste 3 based on [calcination method 1] and [evaluation 1 of shear strength] and the shear strength was evaluated. The result was 28.8 MPa and good strength was obtained. The results are shown in Table 1.

Example 4

[Preparation and Shear Strength Evaluation of Paste 4]

94.0 parts by weight of the slurry solution 1 was separated and collected, and 149 parts by weight of the nickel particle 1, 13.0 parts by weight of α-terpineol, 2.7 parts by weight of tetradecane, and 1.2 parts by weight of the binder resin 1 were mixed therein, and concentration was performed using an evaporator at 60° C. and 100 hPa to prepare 230 parts by weight of a paste 4 (solid content concentration: 92.7 wt %).

A bonding test sample was manufactured at 350° C. from the paste 4 based on [calcination method 1] and [evaluation 1 of shear strength] and the shear strength was evaluated. The result was 8.2 MPa and sufficient strength was obtained. The results are shown in Table 1.

Comparative Example 1

[Preparation and Shear Strength Evaluation of Paste 5]

229 parts by weight of the slurry solution 1 was separated and collected, and 26.8 parts by weight of α-terpineol, 5.8 parts by weight of tetradecane, and 1.9 parts by weight of the binder resin 1 were mixed therein, and concentration was performed using an evaporator at 60° C. and 100 hPa to prepare 190 parts by weight of a paste 5 (solid content concentration: 81.9 wt %).

A bonding test sample was manufactured at 350° C. from the paste 5 based on [calcination method 1] and [evaluation 1 of shear strength] and the shear strength was evaluated. The result was 0.0 MPa and no strength was obtained. The results are shown in Table 1.

Comparative Example 2

[Preparation and Shear Strength Evaluation of Paste 6]

134 parts by weight of the slurry solution 1 was separated and collected, and 23 parts by weight of the nickel particle 1, 8.9 parts by weight of α-terpineol, 1.9 parts by weight of tetradecane, and 0.63 parts by weight of the binder resin 1 were mixed therein, and concentration was performed using an evaporator at 60° C. and 100 hPa to prepare 126 parts by weight of a paste 6 (solid content concentration: 91.0 wt %).

A bonding test sample was manufactured at 350° C. from the paste 6 based on [calcination method 1] and [evaluation 1 of shear strength] and the shear strength was evaluated. The result was 3.7 MPa and sufficient strength was not obtained. The results are shown in Table 1.

Comparative Example 3

[Preparation and Shear Strength Evaluation of Paste 7]

92.1 parts by weight of the slurry solution 1 was separated and collected, and 251 parts by weight of the nickel particle 1, 18.3 parts by weight of α-terpineol, 3.8 parts by weight of tetradecane, and 1.7 parts by weight of the binder resin 1 were mixed therein, and concentration was performed using an evaporator at 60° C. and 100 hPa to prepare 337 parts by weight of a paste 7 (solid content concentration: 93.0 wt %).

A bonding test sample was manufactured at 350° C. from the paste 7 based on [calcination method 1] and [evaluation 1 of shear strength] and the shear strength was evaluated. The result was 0.0 MPa and no strength was obtained. The results are shown in Table 1.

Example 5

<Preparation of Paste 8 and Shear Strength Evaluation>

167 parts by weight of the slurry solution 1 was separated and collected, and 114 parts by weight of the nickel particle 1, 27.0 parts by weight of α-terpineol, and 1.3 parts by weight of the binder resin 1 were mixed therein, and concentration was performed using an evaporator at 60° C. and 100 hPa to prepare 257 parts by weight of paste 8 (solid content concentration: 89.0 wt %).

Figure 2:
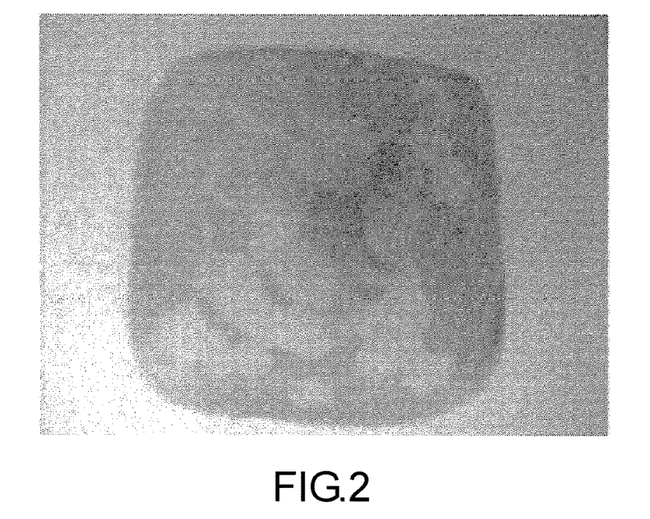
FIG. 2 shows a figure of the X-ray observation results of the bonding layer in the bonding test sample of example 5.

A bonding test sample was manufactured at 300° C. from the paste 8 based on [calcination method 1] and [evaluation 1 of shear strength] and the shear strength was evaluated. The result was 19.8 MPa and sufficient strength was obtained. The results are shown in Table 2. Moreover, the results of the X-ray observation of the bonding layer in the manufactured bonding test sample by observing through a silicon die in a direction perpendicular to the bonding surface are shown in FIG. 2.

Example 6

[Preparation and Shear Strength Evaluation of Paste 9]

193 parts by weight of the slurry solution 1 was separated and collected, and 131 parts by weight of the nickel particle 1, 6.9 parts by weight of α-terpineol, 6.9 parts by weight of 1-undecanol (made by Wako Pure Chemical Industrial Co., Ltd., boiling point: 220° C.), and 1.4 parts by weight of the binder resin 1 were mixed therein, and concentration was performed using an evaporator at 60° C. and 100 hPa to prepare 278 parts by weight of a paste 9 (solid content concentration: 94.5 wt %).

Figure 3:
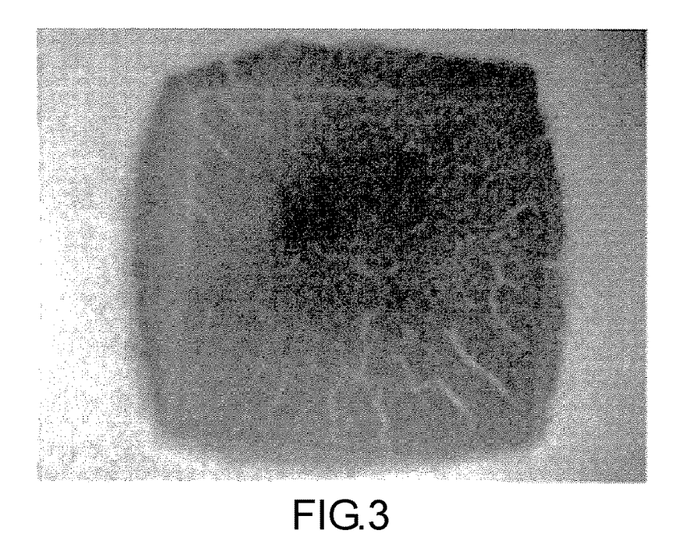
FIG. 3 shows a figure of the X-ray observation results of the bonding layer in the bonding test sample of example 6.
Figure 4:
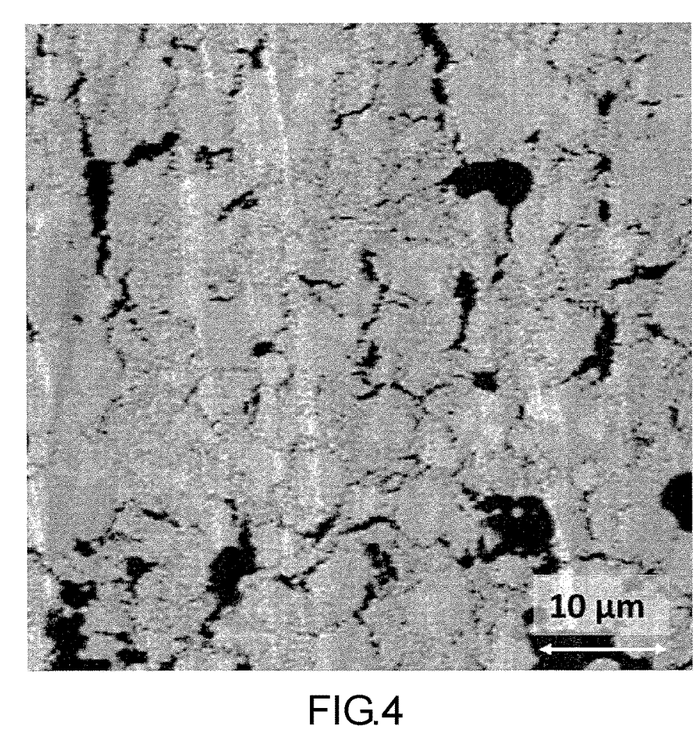
FIG. 4 shows a figure of scanning electron microscope (SEM) observation results of the cross-section of the bonding layer in the bonding test sample of example 6.

A bonding test sample was manufactured at 300° C. from the paste 9 based on [calcination method 1] and [evaluation 1 of shear strength] and the shear strength was evaluated. The result was 39.2 MPa and good strength was obtained. The results are shown in Table 2. Moreover, the results of the X-ray observation of the bonding layer in the manufactured bonding test sample by observing through a silicon die in a direction perpendicular to the bonding surface are shown in FIG. 3, and the results of SEM observation of the cross-section of the bonding layer are shown in FIG. 4.

Example 7

[Preparation and Shear Strength Evaluation of Paste 10]

120 parts by weight of the slurry solution 1 was separated and collected, and 81.9 parts by weight of the nickel particle

TABLE 1

| | Content of nickel particle 1 in paste wt % | Content of nickel fine particle 1 in paste wt % | Weight ratio of nickel particle 1:nickel fine particle 1 | Content of binder resin in paste wt % | Ratio of binder weight to metal weight | Calcination temperature (° C.) | Shear strength (MPa) |
|---|---|---|---|---|---|---|---|
| Example 1 | 36.9 | 55.2 | 40:60 | 0.5 | 0.54 | 350 | 16.0 |
| Example 2 | 45.9 | 45.9 | 50:50 | 0.5 | 0.54 | 350 | 49.0 |
| Example 3 | 55.2 | 36.8 | 60:40 | 0.5 | 0.54 | 350 | 28.8 |
| Example 4 | 64.9 | 27.8 | 70:30 | 0.5 | 0.55 | 350 | 8.2 |
| Comparative example 1 | 0 | 81.9 | 0:100 | 1.0 | 1.22 | 350 | 0.0 |
| Comparative example 2 | 18.2 | 72.7 | 20:80 | 0.5 | 0.55 | 350 | 3.7 |
| Comparative example 3 | 74.4 | 18.6 | 80:20 | 0.5 | 0.54 | 350 | 0.0 |

2 (made by Japan Sigma-Aldrich Associates, product name: Nickel, average particle size obtained by a laser diffraction/scattering method: 1.9 μm, content of nickel element: 99.8 wt % or more relative to entire nickel particle), 13.4 parts by weight of α-terpineol, and 0.9 parts by weight of the binder resin 1 were mixed therein, and concentration was performed using an evaporator at 60° C. and 100 hPa to prepare 178 parts by weight of a paste 10 (solid content concentration: 92.0 wt %).

A bonding test sample was manufactured at 300° C. from the paste 10 based on [calcination method 1] and [evaluation 1 of shear strength] and the shear strength was evaluated. The result was 10.5 MPa and sufficient strength was obtained. The results are shown in Table 2.

Example 8

[Preparation and Shear Strength Evaluation of Paste 11]
127 parts by weight of the slurry solution 1 was separated and collected, and 65.0 parts by weight of the nickel particle 1, 65.0 parts by weight of the nickel particle 2, 5.7 parts by weight of α-terpineol, 5.7 parts by weight of 1-undecanol, and 1.2 parts by weight of the binder resin 1 were mixed therein, and concentration was performed using an evaporator at 60° C. and 100 hPa to prepare 229 parts by weight of a paste 11 (solid content concentration: 89.0 wt %).

A bonding test sample was manufactured at 300° C. from the paste 11 based on [calcination method 1] and [evaluation 1 of shear strength] and the shear strength was evaluated. The result was 32.7 MPa and good strength was obtained. The results are shown in Table 2.

Example 9

[Preparation and Shear Strength Evaluation of Paste 12]
118 parts by weight of the slurry solution 1 was separated and collected, and 101 parts by weight of the nickel particle 1, 20.0 parts by weight of the nickel particle 2, 5.3 parts by weight of α-terpineol, 5.3 parts by weight of 1-undecanol, and 1.1 parts by weight of the binder resin 1 were mixed therein, and concentration was performed using an evaporator at 60° C. and 100 hPa to prepare 213 parts by weight of a paste 12 (solid content concentration: 94.5 wt %).

A bonding test sample was manufactured at 300° C. from the paste 12 based on [calcination method 1] and [evaluation 1 of shear strength] and the shear strength was evaluated. The result was 43.4 MPa and sufficient strength was obtained. The results are shown in Table 2.

Comparative Example 4

[Preparation of Paste 13]
151 parts by weight of the slurry solution 1 was separated and collected, and 12.8 parts by weight of α-terpineol was mixed therein, and concentration was performed using an evaporator at 60° C. and 100 hPa to prepare 126 parts by weight of a paste 13 (solid content concentration: 88.9 wt %).

Figure 5:
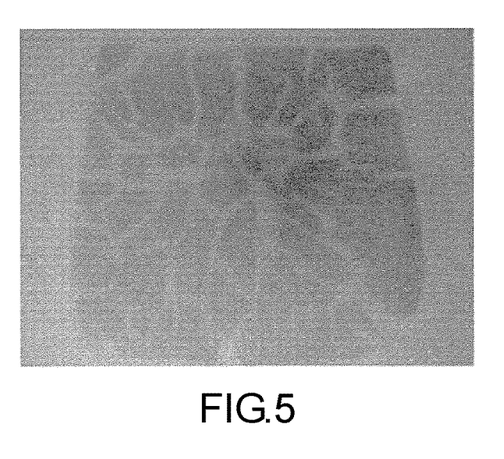
FIG. 5 shows a figure of the X-ray observation results of the bonding layer in the bonding test sample of comparative example 4.

A bonding test sample was manufactured at 300° C. from the paste 13 based on [calcination method 1] and [evaluation 1 of shear strength] and the shear strength was evaluated. The result was 0.0 MPa and no strength was obtained. The results are shown in Table 2. Moreover, the results of the X-ray observation of the bonding layer in the manufactured bonding test sample by observing through a silicon die in a direction perpendicular to the bonding surface are shown in FIG. 5.

Comparative Example 5

[Preparation of Paste 14]
163 parts by weight of the slurry solution 1 was separated and collected, and 13.2 parts by weight of α-terpineol, 2.0 parts by weight of 1-undecanol, and 0.63 parts by weight of the binder resin 1 were mixed therein, and concentration was performed using an evaporator at 60° C. and 100 hPa to prepare 126 parts by weight of a paste 14 (solid content concentration: 92.1 wt %).

Figure 6:
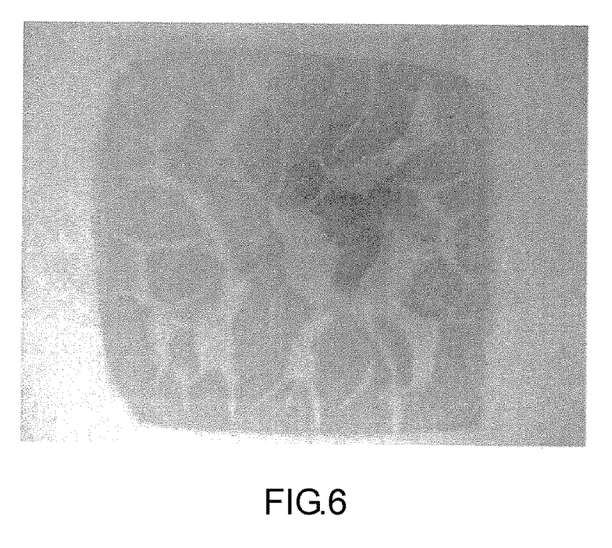
FIG. 6 shows a figure of the X-ray observation results of the bonding layer in the bonding test sample of comparative example 5.

A bonding test sample was manufactured at 300° C. from the paste 14 based on [calcination method 1] and [evaluation 1 of shear strength] and the shear strength was evaluated. The result was 2.5 MPa and sufficient strength was not obtained. The results are shown in Table 2. Moreover, the results of the X-ray observation of the bonding layer in the manufactured bonding test sample by observing through a silicon die in a direction perpendicular to the bonding surface are shown in FIG. 6.

Comparative Example 6

[Preparation of Paste 15]
121 parts by weight of the slurry solution 1 was separated and collected, and 82.5 parts by weight of the nickel particle 1, 4.8 parts by weight of α-terpineol, and 4.8 parts by weight of 1-undecanol were mixed therein, and concentration was performed using an evaporator at 60° C. and 100 hPa to prepare 175 parts by weight of a paste 15 (solid content concentration: 94.5 wt %).

A bonding test sample was manufactured at 300° C. from the paste 15 based on [calcination method 1] and [evaluation 1 of shear strength] and the shear strength was evaluated. The result was 0.0 MPa and no strength was obtained. The results are shown in Table 2.

TABLE 2

| | Content of nickel particle 1 in paste wt % | Content of nickel particle 2 in paste wt % | Content of nickel fine particle 1 in paste wt % | Weight ratio of nickel particle 1:nickel particle 2:nickel fine particle 1 | Content of binder in paste wt % | Ratio of binder weight to metal weight | Calcination temperature (° C.) | Shear strength (MPa) |
|---|---|---|---|---|---|---|---|---|
| Example 5 | 44.5 | 0.0 | 44.5 | 50:0:50 | 0.50 | 0.56 | 300 | 19.8 |
| Example 6 | 47.3 | 0.0 | 47.3 | 50:0:50 | 0.50 | 0.53 | 300 | 39.2 |
| Example 7 | 0.0 | 46.0 | 46.0 | 0:50:50 | 0.50 | 0.54 | 300 | 10.5 |
| Example 8 | 28.4 | 28.4 | 37.7 | 30:30:40 | 0.50 | 0.53 | 300 | 32.7 |

TABLE 2-continued

|  | Content of nickel particle 1 in paste wt % | Content of nickel particle 2 in paste wt % | Content of nickel fine particle 1 in paste wt % | Weight ratio of nickel particle 1:nickel particle 2:nickel fine particle 1 | Content of binder in paste wt % | Ratio of binder weight to metal weight | Calcination temperature (° C.) | Shear strength (MPa) |
|---|---|---|---|---|---|---|---|---|
| Example 9 | 47.3 | 9.5 | 37.7 | 50:10:40 | 0.50 | 0.53 | 300 | 43.4 |
| Comparative example 4 | 0.0 | 0.0 | 88.9 | 0:0:100 | 0.0 | 0.0 | 300 | 0.0 |
| Comparative example 5 | 0.0 | 0.0 | 89.0 | 0:0:100 | 0.50 | 0.56 | 300 | 2.5 |
| Comparative example 6 | 47.3 | 0.0 | 47.3 | 50:0:50 | 0.0 | 0.0 | 300 | 0.0 |

According to Table 1 and Table 2, it is confirmed that by using the bonding materials containing the nickel particle composition of the invention containing the component A to the component C, a sturdy bonding layer having high shear strength can be obtained. In comparison, in comparative example 1 to comparative example 5 for which the weight ratio of the nickel particles of the component A and the nickel fine particles of the component B (component A:component B) is outside the range of 30:70 to 70:30 and comparative example 6 which does not contain the organic binder of the component C, the bonding layers all have low shear strength and are all weak.

Example 10

[Preparation and Shear Strength Evaluation of Paste 16]

106 parts by weight of the slurry solution 1 was separated and collected, and 72.2 parts by weight of the nickel particle 2, 3.8 parts by weight of α-terpineol, 3.8 parts by weight of 1-undecanol, and 0.77 parts by weight of the binder resin 1 were mixed therein, and concentration was performed using an evaporator at 60° C. and 100 hPa to prepare 153 parts by weight of a paste 16 (solid content concentration: 94.5 wt %).

A bonding test sample was manufactured at 300° C. from the paste 16 based on [calcination method 1] and [evaluation 1 of shear strength] and the shear strength was evaluated. The result was 13.7 MPa and sufficient strength was obtained. The results are shown in Table 3.

Example 11

<Preparation of Paste 17 and Shear Strength Evaluation>

160 parts by weight of the slurry solution 1 was separated and collected, and 109 parts by weight of the nickel particle 1, 6.1 parts by weight of α-terpineol, 6.1 parts by weight of 1-undecanol, and 0.46 parts by weight of the binder resin 1 were mixed therein, and concentration was performed using an evaporator at 60° C. and 100 hPa to prepare 231 parts by weight of a paste 17 (solid content concentration: 94.5 wt %).

A bonding test sample was manufactured at 300° C. from the paste 17 based on [calcination method 1] and [evaluation 1 of shear strength] and the shear strength was evaluated. The result was 13.4 MPa and sufficient strength was obtained. The results are shown in Table 3.

Example 12

<Preparation of Paste 18 and Shear Strength Evaluation>

179 parts by weight of the slurry solution 1 was separated and collected, and 122 parts by weight of the nickel particle 1, 6.6 parts by weight of α-terpineol, 6.6 parts by weight of 1-undecanol, 2.6 parts by weight of diethylene glycol (made by Kanto Chemical Industry Co., Ltd., boiling point: 244° C.), and 2.6 parts by weight of the binder resin 1 were mixed therein, and concentration was performed using an evaporator at 60° C. and 100 hPa to prepare 262 parts by weight of a paste 18 (solid content concentration: 93.0 wt %).

A bonding test sample was manufactured at 300° C. from the paste 18 based on [calcination method 1] and [evaluation 1 of shear strength] and the shear strength was evaluated. The result was 20.8 MPa and good strength was obtained. The results are shown in Table 3.

Example 13

<Preparation of Paste 19 and Shear Strength Evaluation>

191 parts by weight of the slurry solution 1 was separated and collected, and 130 parts by weight of the nickel particle 1, 23.4 parts by weight of α-terpineol, 23.4 parts by weight of 1-undecanol, and 4.7 parts by weight of the binder resin 1 were mixed therein, and concentration was performed using an evaporator at 60° C. and 100 hPa to prepare 312 parts by weight of a paste 19 (solid content concentration: 83.5 wt %).

A bonding test sample was manufactured at 300° C. from the paste 19 based on [calcination method 1] and [evaluation 1 of shear strength] and the shear strength was evaluated. The result was 20.7 MPa and good strength was obtained. The results are shown in Table 3.

Example 14

[Preparation of Paste 20]

126 parts by weight of the slurry solution 1 was separated and collected, and 85.8 parts by weight of the nickel particle 1, 12.1 parts by weight of α-terpineol, 2.8 parts by weight of the binder resin 2 (made by BYK-Chemie•Japan, Co., Ltd., product name: BYK-220S) were mixed therein, and concentration was performed using an evaporator at 60° C. and 100 hPa to prepare 186 parts by weight of a paste 20 (solid content concentration: 92.0 wt %).

A bonding test sample was manufactured at 300° C. from the paste 20 based on [calcination method 1] and [evaluation 1 of shear strength] and the shear strength was evaluated. The result was 23.5 MPa and sufficient strength was obtained. The results are shown in Table 3.

Comparative Example 7

[Preparation of Paste 21]

169 parts by weight of the slurry solution 1 was separated and collected, and 115 parts by weight of the nickel particle 1, 39.7 parts by weight of α-terpineol, 39.7 parts by weight of 1-undecanol, and 7.9 parts by weight of the binder resin 1 were mixed therein, and concentration was performed using an evaporator at 60° C. and 100 hPa to prepare 317 parts by weight of a paste 21 (solid content concentration: 72.5 wt %).

A bonding test sample was manufactured at 300° C. from the paste 21 based on [calcination method 1] and [evaluation 1 of shear strength] and the shear strength was evaluated. The result was 0.0 MPa and no strength was obtained. The results are shown in Table 3.

TABLE 3

| | Content of nickel particle 1 in paste wt % | Content of nickel particle 2 in paste wt % | Content of nickel fine particle 1 in paste wt % | Weight ratio of nickel particle 1:nickel particle 2:nickel fine particle 1 | Content of binder in paste wt % | Ratio of binder weight to metal weight | Calcination temperature (° C.) | Shear strength (MPa) |
|---|---|---|---|---|---|---|---|---|
| Example 10 | 0.0 | 47.3 | 47.3 | 0:50:50 | 0.50 | 0.53 | 300 | 13.7 |
| Example 11 | 47.3 | 0.0 | 47.3 | 50:0:50 | 0.20 | 0.21 | 300 | 13.4 |
| Example 12 | 46.5 | 0.0 | 46.5 | 50:0:50 | 1.00 | 1.08 | 300 | 20.8 |
| Example 13 | 41.7 | 0.0 | 41.7 | 50:0:50 | 1.50 | 1.80 | 300 | 20.7 |
| Example 14 | 46.0 | 0.0 | 46.0 | 50:0:50 | 1.50 | 1.63 | 300 | 23.5 |
| Comparative example 7 | 40.0 | 0.0 | 40.0 | 50:0:50 | 2.50 | 3.43 | 300 | 0.0 |

Synthesis Example 2

33 parts by weight of nickel acetate tetrahydrate was added to 211 parts by weight of oleyl amine and the mixture was heated at 150° C. for 20 minutes under a nitrogen flow to dissolve nickel acetate and obtain a complexation reaction solution. Next, 100 parts by weight of oleyl amine was added in the complexation reaction solution, and the mixture was heated using a microwave at 250° C. for 5 minutes to obtain a nickel fine particle slurry 2.

After the nickel fine particle slurry 2 obtained in synthesis example 2 was separated by being left to stand and the supernatant was removed, cleaning was performed using toluene and methanol, and then drying was performed in a vacuum dryer at a constant temperature of 60° C. for 6 hours to obtain a nickel fine particle 2 (average primary particle size: 119 min).

[Preparation of Slurry Solution 2]

100 parts by weight of the nickel fine particle slurry 2 obtained in synthesis example 2 was separated and collected and 20 parts by weight of octanoic acid was added thereto. After stirring for 15 minutes, washing was performed using toluene to prepare a slurry solution 2 (solid content concentration: 70.9 wt %).

Synthesis Example 3

18.5 parts by weight of nickel formate dihydrate was added to 182 parts by weight of oleyl amine and the mixture was heated at 120° C. for 10 minutes under a nitrogen flow to dissolve nickel formate and obtain a complexation reaction solution. Next, 121 parts by weight of oleyl amine was added in the complexation reaction solution, and the mixture was heated using a microwave at 180° C. for 10 minutes to obtain a nickel fine particle slurry 3.

After the nickel fine particle slurry 3 obtained in synthesis example 3 was separated by being left to stand and the supernatant was removed, cleaning was performed using toluene and methanol, and then drying was performed in a vacuum dryer at a constant temperature of 60° C. for 6 hours to obtain a nickel fine particle 3 (average primary particle size: 40 nm).

[Preparation of Slurry Solution 3]

100 parts by weight of the nickel fine particle slurry 3 obtained in synthesis example 3 was separated and collected and 20 parts by weight of octanoic acid was added thereto. After stirring for 15 minutes, washing was performed using toluene to prepare a slurry solution 3 (solid content concentration: 67.3 wt %).

Example 15

[Preparation and Shear Strength Evaluation of Paste 22]

141 parts by weight of the slurry solution 2 was separated and collected, and 100 parts by weight of the nickel particle 1, 5.3 parts by weight of α-terpineol, 5.3 parts by weight of 1-undecanol, and 1.1 parts by weight of the binder resin 1 were mixed therein, and concentration was performed using an evaporator at 60° C. and 100 hPa to prepare 212 parts by weight of a paste 22 (solid content concentration: 94.5 wt %).

A bonding test sample was manufactured at 300° C. from the paste 22 based on [calcination method 1] and [evaluation 1 of shear strength] and the shear strength was evaluated. The result was 26.4 MPa and good strength was obtained. The results are shown in Table 4.

Example 16

[Preparation and Shear Strength Evaluation of Paste 23]

202 parts by weight of the slurry solution 3 was separated and collected, and 136 parts by weight of the nickel particle 1, 7.2 parts by weight of α-terpineol, 7.2 parts by weight of 1-undecanol, and 1.5 parts by weight of the binder resin 1 were mixed therein, and concentration was performed using an evaporator at 60° C. and 100 hPa to prepare 288 parts by weight of a paste 23 (solid content concentration: 94.5 wt %).

A bonding test sample was manufactured at 300° C. from the paste 23 based on [calcination method 1] and [evaluation 1 of shear strength] and the shear strength was evaluated. The result was 20.0 MPa and good strength was obtained. The results are shown in Table 4.

Example 17

[Shear Strength Evaluation of Paste 23]

A bonding test sample was manufactured at 250° C. from the paste 23 based on [calcination method 1] and [evaluation 1 of shear strength] and the shear strength was evaluated. The result was 13.7 MPa and sufficient strength was obtained. The results are shown in Table 4.

Example 18

[Shear Strength Evaluation of Paste 9]

A bonding test sample was manufactured at 250° C. from the paste 9 based on [calcination method 1] and [evaluation 1 of shear strength] and the shear strength was evaluated. The result was 19.2 MPa and good strength was obtained. The results are shown in Table 4.

TABLE 4

| | Nickel particle 1 Content in paste wt % | Nickel fine particle Average particle size of fine particle | Content in paste wt % | Weight ratio of nickel particle:nickel fine particle | Content of binder in paste wt % | Ratio of binder weight to metal weight | Calcination temperature (° C.) | Shear strength (MPa) |
|---|---|---|---|---|---|---|---|---|
| Example 15 | 47.3 | Nickel fine particle 2 119 nm | 47.3 | 50:50 | 0.50 | 0.56 | 300 | 26.4 |
| Example 16 | 47.3 | Nickel fine particle 3 40 nm | 47.3 | 50:50 | 0.50 | 0.56 | 300 | 20.0 |
| Example 17 | 47.3 | Nickel fine particle 3 40 nm | 47.3 | 50:50 | 0.50 | 0.56 | 250 | 13.7 |
| Example 18 | 47.3 | Nickel fine particle 1 92 nm | 47.3 | 50:50 | 0.50 | 0.56 | 250 | 19.2 |

In the above, detailed description is exemplarily provided for the implementations of the invention, but the invention is not limited to the implementations.

The present international application claims priority for JP 2014-135245 filed on Jun. 30, 2014, and references the entire content of the application in the present application.

What is claimed is:

1. A nickel particle composition, comprising the following component A to component C:
   component A: a nickel particle having an average particle size in a range of 0.5 μm to 20 μm obtained via a laser diffraction/scattering method and containing 50 wt % or more of a nickel element;
   component B: a nickel fine particle having an average primary particle size in a range of 30 nm to 200 nm observed via a scanning electron microscope and containing 50 wt % or more of the nickel element; and
   component C: an organic binder in a range of 0.1 wt % to 2.5 wt % relative to a total metal content; and
   a weight ratio of the component A to the component B (component A:component B) is in a range of 30:70 to 70:30.

2. The nickel particle composition of claim 1, wherein a content of the nickel element of the component A is 99.0 wt % or more.

3. The nickel particle composition of claim 1, wherein a content of the nickel element of the component B is in a range of 90 wt % to 99.0 wt %.

4. The nickel particle composition of claim 1, wherein a content of the nickel element of the component A is 99.0 wt % or more, and a content of the nickel element of the component B is in a range of 90 wt % to 99.0 wt %.

5. The nickel particle composition of claim 1, wherein a content of the nickel element of the component A is 99.0 wt % or more, a content of the nickel element of the component B is in a range of 90 wt % to 99.0 wt %, and a content of the component C to the total metal content is in a range of 0.3 wt % to 1.5 wt %.

6. A bonding material, comprising the nickel particle composition of claim 1, wherein a content of the nickel particle composition is in a range of 70 wt % to 96 wt %.

7. The bonding material of claim 6, further comprising an organic solvent having a boiling point in a range of 100° C. to 300° C., wherein a content of the organic solvent is in a range of 4 wt % to 30 wt %.

8. The bonding material of claim 7, wherein relative to all of the organic solvent, the organic solvent contains at least one selected from the group consisting of 1-undecanol and tetradecane in a range of 15 wt % to 50 wt %.

9. A bonding method, comprising placing the bonding material of claim 6 between members to be bonded and performing heating at a temperature in a range of 200° C. to 400° C. in a reductive gas environment containing a reductive gas to form a bonding layer between the bonding members to be bonded.

* * * * *